US012700928B2

(12) United States Patent
Karman et al.

(10) Patent No.: US 12,700,928 B2
(45) Date of Patent: Aug. 4, 2026

(54) RADIO TRANSMITTER

(71) Applicants:Cypress Semiconductor Corporation, San Jose, CA (US); POLITECNICO DI MILANO, Milan (IT)

(72) Inventors: Saleh Karman, Villach (AT); Riccardo Moleri, Romano di Lombardia (IT); Giacomo Castoro, Trapani (IT); Simone Mattia Dartizio, Milan (IT)

(73) Assignees: Infineon Technologies Americas Corp., El Segundo, CA (US); Infineon Technologies Austria AG, Villach (AT)

( * ) Notice: Subject to any disclaimer, the term of this patent is extended or adjusted under 35 U.S.C. 154(b) by 3 days.

(21) Appl. No.: 18/902,007

(22) Filed: Sep. 30, 2024

(65) Prior Publication Data

US 2026/0095264 A1 Apr. 2, 2026

(51) Int. Cl.
*H04B 17/12* (2015.01)
*G04F 10/00* (2006.01)
(Continued)

(52) U.S. Cl.
CPC .......... *H04B 17/12* (2015.01); *G04F 10/005* (2013.01); *H03K 3/037* (2013.01); *H03K 5/00006* (2013.01)

(58) Field of Classification Search
CPC ....... G04F 10/00; G04F 10/005; H03K 3/037; H03K 5/01; H03K 5/13; H03K 5/00006; H03L 7/08; H03L 7/18; H03L 7/033; H03L 7/085; H03L 7/099; H03M 1/06; H03M 1/10; H03M 1/34; H03M 1/50; H04B 17/12
(Continued)

(56) References Cited

U.S. PATENT DOCUMENTS 8,570,082 B1 * 10/2013 Kuo .......................... H03L 1/00
327/158
8,669,890 B2 * 3/2014 Wang .................... G04F 10/005
327/107
(Continued)

OTHER PUBLICATIONS

Simone M. Dartizio, et al., "A Low-Spur and Low-Jitter Fractional-N Digital PLL Based no an Inverse-Constant-Slope DTC and FCW Subtractive Dithering", IEE Journal of Solid-State Circuits, vol. 58, No. 12, Dec. 2023; 18 pages.

*Primary Examiner* — Shawkat M Ali

(57) ABSTRACT

In an embodiment, a frequency synthesizer includes a digitally controlled oscillator configured to generate an output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, a loop filter connected to the time-to-digital converter and configured to generate the digital control word based on the phase error signal, and a calibration unit configured to generate a training sequence to generate a gain error signal, and modify the bias control word based on the gain error signal to generate a modified bias control word.

20 Claims, 8 Drawing Sheets

112

(51) Int. Cl.
 *H03K 3/037* (2006.01)
 *H03K 5/00* (2006.01)
(58) Field of Classification Search
 USPC ........ 327/147, 156, 159, 161; 375/219, 260,
 375/295–297, 316, 376
 See application file for complete search history.

(56) References Cited

U.S. PATENT DOCUMENTS

| | | | | |
|---|---|---|---|---|
| 10,594,329 B1 * | 3/2020 | Elkholy | ................. | H03L 7/081 |
| 11,418,199 B1 * | 8/2022 | Cherniak | ................ | H03L 7/087 |
| 11,569,831 B1 | 1/2023 | Grimaldi et al. | | |

* cited by examiner

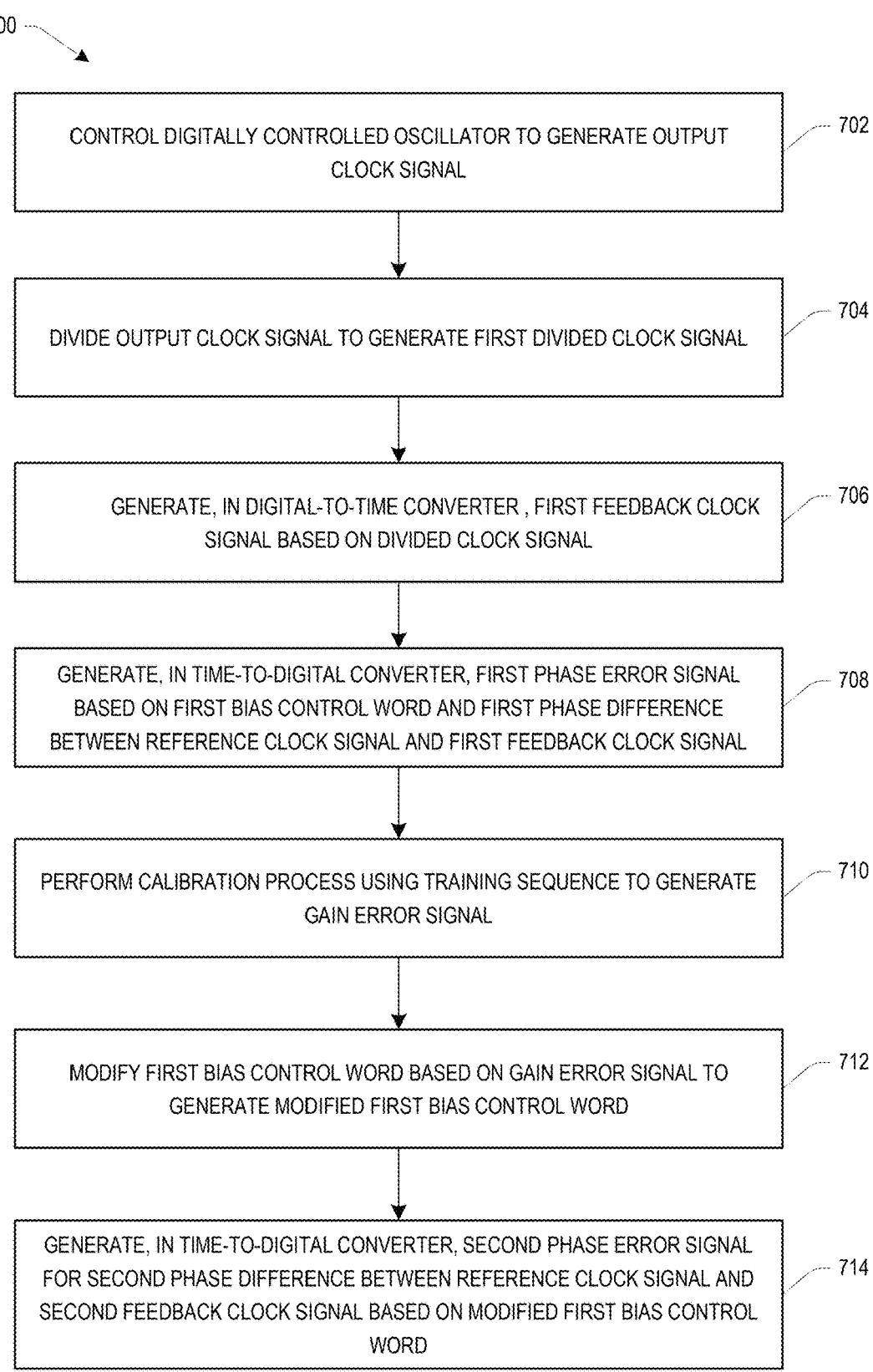

700

702
CONTROL DIGITALLY CONTROLLED OSCILLATOR TO GENERATE OUTPUT CLOCK SIGNAL

704
DIVIDE OUTPUT CLOCK SIGNAL TO GENERATE FIRST DIVIDED CLOCK SIGNAL

706
GENERATE, IN DIGITAL-TO-TIME CONVERTER , FIRST FEEDBACK CLOCK SIGNAL BASED ON DIVIDED CLOCK SIGNAL

708
GENERATE, IN TIME-TO-DIGITAL CONVERTER, FIRST PHASE ERROR SIGNAL BASED ON FIRST BIAS CONTROL WORD AND FIRST PHASE DIFFERENCE BETWEEN REFERENCE CLOCK SIGNAL AND FIRST FEEDBACK CLOCK SIGNAL

710
PERFORM CALIBRATION PROCESS USING TRAINING SEQUENCE TO GENERATE GAIN ERROR SIGNAL

712
MODIFY FIRST BIAS CONTROL WORD BASED ON GAIN ERROR SIGNAL TO GENERATE MODIFIED FIRST BIAS CONTROL WORD

714
GENERATE, IN TIME-TO-DIGITAL CONVERTER, SECOND PHASE ERROR SIGNAL FOR SECOND PHASE DIFFERENCE BETWEEN REFERENCE CLOCK SIGNAL AND SECOND FEEDBACK CLOCK SIGNAL BASED ON MODIFIED FIRST BIAS CONTROL WORD

Fig. 7

RADIO TRANSMITTER

TECHNICAL FIELD

The present disclosure relates to the field of communications, and more particularly to a transmitter for a radio.

BACKGROUND

Low power networked devices, such as Internet of Things (IoT) devices require energy efficiency. The vast networks of battery-operated low-power IoT devices are constrained by their battery usage. Application fields such as home automation require IoT devices that operate in random-sparse event modes, which result in high power consumption due to idle listening time of a transceiver.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a method comprises controlling a digitally controlled oscillator to generate an output clock signal, dividing the output clock signal to generate a first divided clock signal, generating, in a digital-to-time converter, a first feedback clock signal based on the divided clock signal, generating, in a time-to-digital converter, a first phase error signal based on a first bias control word and a first phase difference between a reference clock signal and the first feedback clock signal, performing a calibration process using a training sequence to generate a gain error signal, modifying the first bias control word based on the gain error signal to generate a modified first bias control word, and generating, in the time-to-digital converter, a second phase error signal for a second phase difference between the reference clock signal and a second feedback clock signal based on the modified first bias control word.

In an embodiment, a system comprises means for controlling a digitally controlled oscillator to generate an output clock signal, means for dividing the output clock signal to generate a first divided clock signal, means for generating, in a digital-to-time converter, a first feedback clock signal based on the divided clock signal, means for generating, in a time-to-digital converter, a first phase error signal based on a first bias control word and a first phase difference between a reference clock signal and the first feedback clock signal, means for performing a calibration process using a training sequence to generate a gain error signal, means for modifying the first bias control word based on the gain error signal to generate a modified first bias control word, and means for generating, in the time-to-digital converter, a second phase error signal for a second phase difference between the reference clock signal and a second feedback clock signal based on the modified first bias control word.

In an embodiment, a frequency synthesizer comprises a digitally controlled oscillator configured to generate an output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, a loop filter connected to the time-to-digital converter and configured to generate the digital control word based on the phase error signal, and a calibration unit configured to generate a training sequence to generate a gain error signal, and modify the bias control word based on the gain error signal to generate a modified bias control word.

In an embodiment, a radio comprises an antenna port, a transmit-receive switch connected to the antenna port, a receive path connected to the transmit-receive switch, and a transmit path connected to the transmit-receive switch, and a processor configured to connect the receive path to the transmit-receive switch in a receive mode of the radio and connect the transmit path to the transmit-receive switch in a transmit mode of the radio, wherein the transmit path comprises a frequency synthesizer configured to generate an output clock signal, a local oscillator generator configured to generate a local oscillator signal based on the output clock signal, and a power amplifier connected to the transmit-receive switch and configured to amplify the local oscillator signal to generate a transmit signal, and the frequency synthesizer comprises a digitally controlled oscillator configured to generate an output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, a loop filter connected to the time-to-digital converter and configured to generate the digital control word based on the phase error signal, and a calibration unit configured to generate a training sequence to generate a gain error signal, and modify the bias control word based on the gain error signal to generate a modified bias control word.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 7 is a diagram illustrating an example method for calibrating a digital phase locked loop, according to some embodiments.

DETAILED DESCRIPTION

Figure 1:
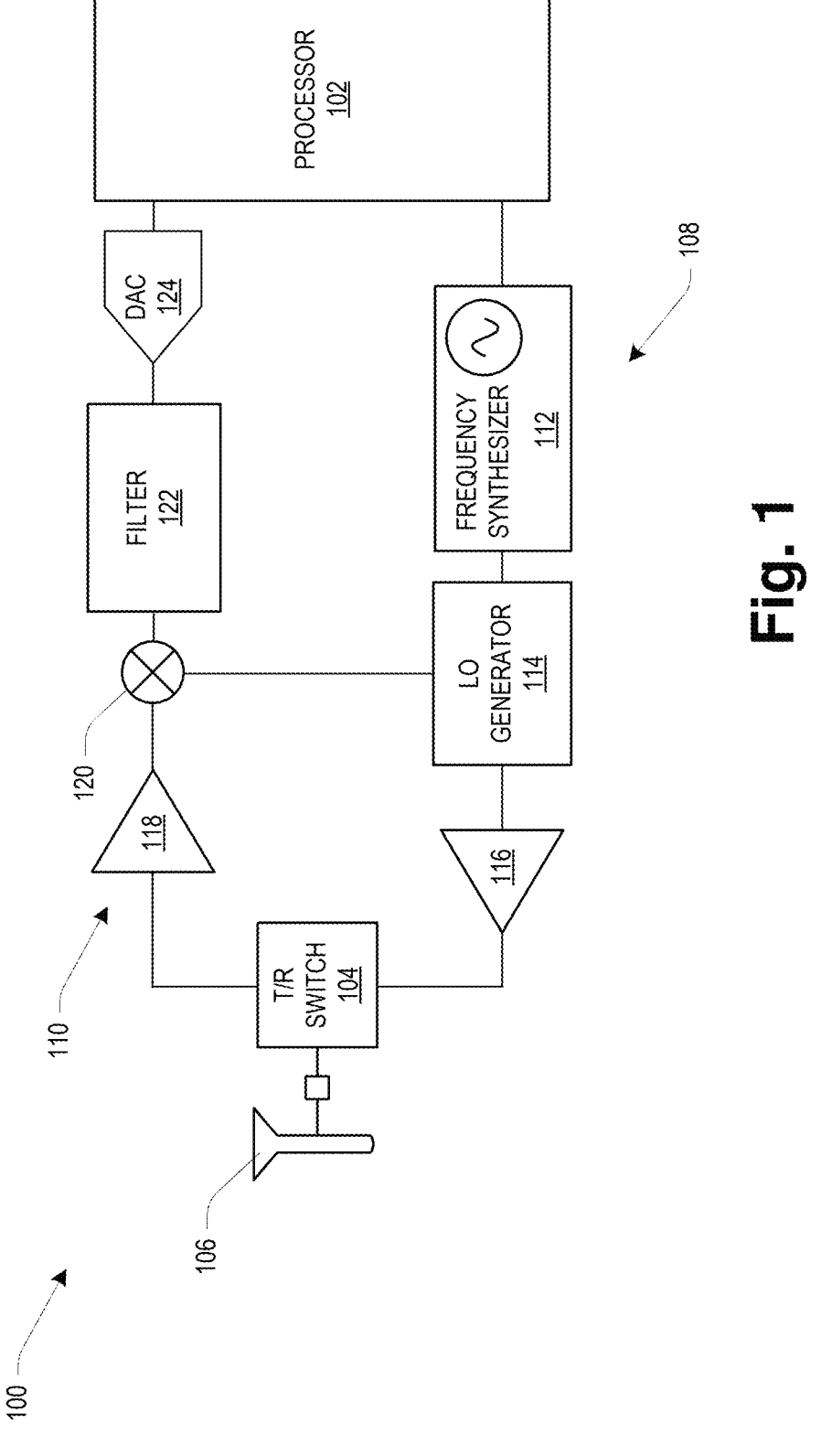
FIG. 1 is a diagram of a radio, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

FIG. 1 is a simplified block diagram of a radio 100, according to some embodiments. The radio 100 may support one or more communication protocols, such as a Bluetooth (BT), Bluetooth Low Energy (BLE), Wi-Fi, or some other communication protocol. According to some embodiments, the radio comprises a processor 102, such as a digital base band processor, and a transmit-receive (T-R) switch 104 configured to selectively connect an antenna 106 to a transmit path 108 or a receive path 110. In some embodiments, the transmit path 108 comprises a frequency synthesizer 112 configured to generate an output clock signal, a local oscillator (LO) generator 114 configured to generate an LO signal based on the output clock signal, and a power amplifier 116 connected to the T-R switch 104 and configured to amplify the LO signal to generate a transmit signal. In some embodiments, the receive path 110 comprises a low noise amplifier 118 for amplifying a receive signal a mixer 120 for mixing the receive signal and the LO signal, a filter 122, such as baseband filter or an intermediate frequency filter (depending on the radio architecture), for demodulating the receive signal, and the digital-to-analog converter (DAC) 124 for digitizing the receive signal.

The processor 102 implements a software or firmware application that controls communication by the radio 100. The processor 102 includes one or multiple processors, microprocessors, data processors, co-processors, application specific integrated circuits (ASICs), controllers, programmable logic devices, chipsets, field-programmable gate arrays (FPGAs), application specific instruction-set processors (ASIPs), system-on-chips (SoCs), central processing units (CPUs) (e.g., one or multiple cores), microcontrollers, and/or some other type of component that interprets and/or executes instructions and/or data. The processor 102 may be implemented as hardware (e.g., a microprocessor, etc.) or a combination of hardware and software (e.g., a SoC, an ASIC, etc.) and may include one or multiple memories (e.g., cache, random access memory (RAM), dynamic random access memory (DRAM), cache, read only memory (ROM), a programmable read only memory (PROM), a static random access memory (SRAM), a single in-line memory module (SIMM), a dual in-line memory module (DIMM), a flash memory, and/or some other suitable type of memory). The processor 102 controls the T-R switch 104 to toggle between transmit and receive modes such that the transmit path 108 is connected to the antenna 106 during a transmit mode and the receive path 110 is connected to the antenna 106 during a receive mode. The radio 100 may include fewer components, additional components, different components, and/or a different arrangement of components than those illustrated in FIG. 1.

Figure 2:
FIG. 2 is a diagram illustrating a frequency synthesizer, according to some embodiments.

FIG. 2 is a simplified block diagram of the frequency synthesizer 112, according to some embodiments. In some embodiments, the frequency synthesizer 112 is employs a digital phase locked loop (DLLP) topology. The frequency synthesizer 112 comprises a crystal oscillator (XO) 200 configured to generate an analog reference clock signal (CKR), a time-to-digital converter (TDC) 202 configured to generate a phase error signal ($tdc_0[k]$) based on a phase difference between the reference clock signal (CKR) and a feedback clock signal (CKF), a digital loop filter 204 configured to filter the phase error signal, $tdc_0[k]$, to generate a control signal ($tw_{DCO}[k]$), and a digitally controlled oscillator 206 to generate an output clock signal (CKV) based on the control signal ($tw_{DCO}[k]$). In some embodiments, the feedback clock signal (CKF) is generated by a multi-modulus divider (MMD) 208 configured to divide the output clock signal (CKV) to generate a divided clock signal (CKD) and a digital-to-time converter (DTC) 210 configured to cancel quantization noise generated in the MMD 208 and generate the analog feedback clock signal (CKF).

In some embodiments, a TDC calibration unit 212 calibrates the TDC 202. The TDC calibration unit 212 generates a training sequence ($ts_C[k]$) that is combined with a frequency control word (FCW) in an addition unit 214 and provided to a sigma-delta modulator (SDM) 216. Multiplying the FCW by the frequency of the reference clock signal (CKR) defines the target frequency of the frequency synthesizer 112. An output of the SDM 216 is provided to the MMD 208 and a factor representing accumulated quantization error of the SDM 216 is scaled by a gain factor ($g_{DTC}$) in a multiplication unit 218 and provided to the DTC 210.

Figure 3:
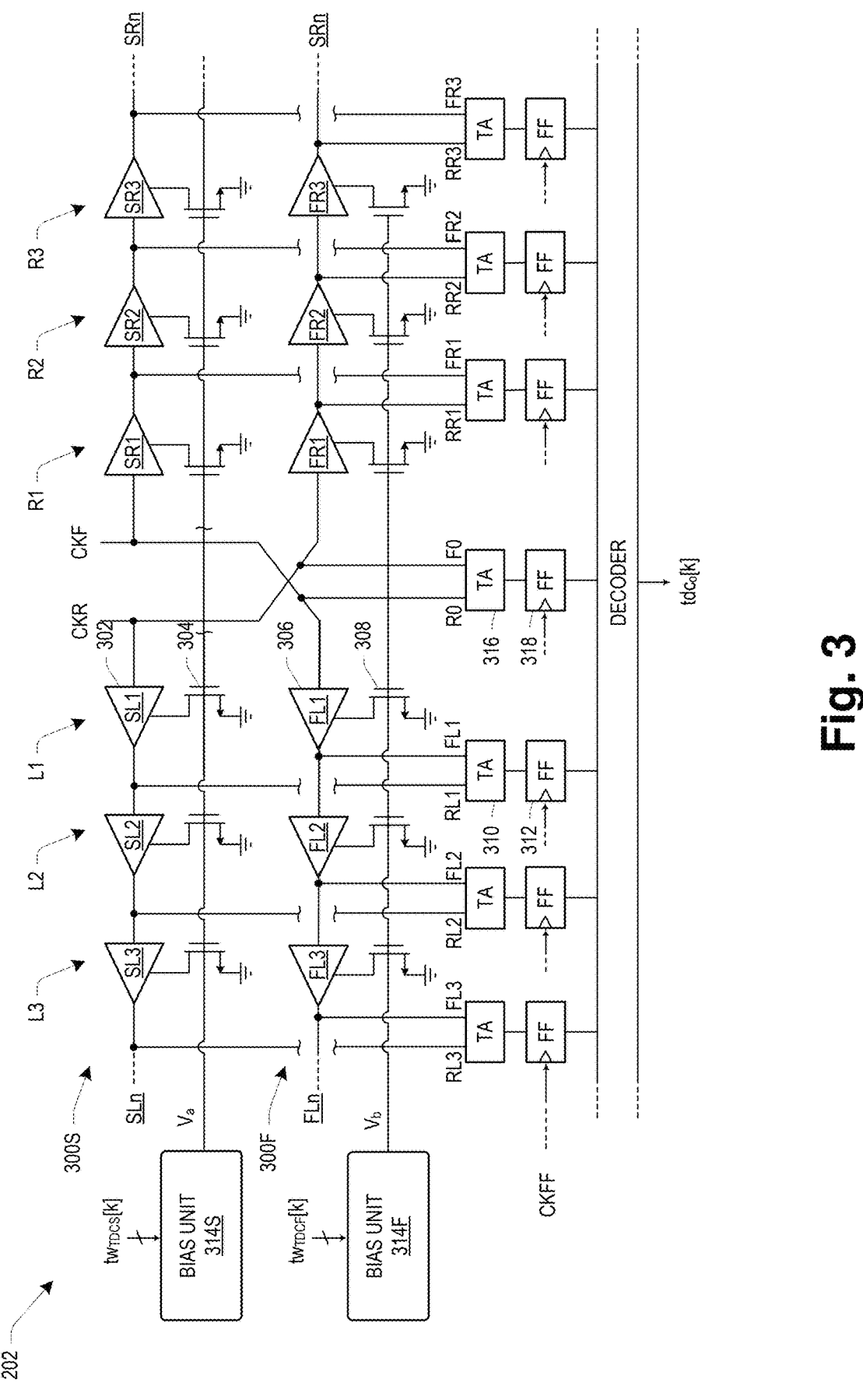
FIG. 3 is a diagram of a time-to-digital converter (TDC), according to some embodiments.

FIG. 3 is a simplified block diagram of the TDC 202, according to some embodiments. The reference clock signal (CKR) and the feedback clock signal (CKF) are buffered through a slow chain 300S of buffers including left side buffers SL1, SL2, SL3, . . . , SLn and right side buffers SR1, SR2, SR3, . . . , SRn and a fast chain 300F of buffers including left side buffers FL1, FL2, FL3, . . . FLn and right side buffers FR1, FR2, FR3, . . . , FRn. The chains 300S, 300F may be arranged in stages L1, L2, L3, . . . Ln, R1, R2, R3, . . . , Rn. The CKR signal is provided to the buffers SL1 . . . SLn, FR1 . . . FRn and the CKF signal is provided to the buffers FL1 . . . FLn, SR1 . . . SRn. As illustrated for the stage L1, each stage L1, L2, L3, . . . Ln, R1, R2, R3, . . . , Rn comprises a slow chain buffer 302 having a delay controlled by a current source 304, a fast stage buffer 306 having a delay controlled by a current source 308, a time arbiter (TA) 310 that indicates which buffer 302, 306 triggers first, and a flip flop (FF) 312 for sampling the time arbiter 310. The time arbiters 310 receive the outputs from the buffers 302, 306 of the stage L1, L2, L3, . . . Ln, R1, R2, R3, . . . , Rn (e.g., RL1/DL1, RL2/DL2, RL3,/DL3, RR1/DR1, RR2/DR2, RR3/DR3), and the flip flops 312 sample the outputs of the time arbiters 310. A latch element may be defined by the time arbiter 310, the flip flop 312, or the time arbiter 310 and the flip flop 312.

In some embodiments, the buffers 302, 306 are current starved buffers having a delay that can be trimmed by the associated current sources 304, 308. Bias units 314S, 314F control biases (Va, Vb) applied to the current sources 304, 306 in the respective chain 300S, 300F. In some embodiments, the bias unit 314S has a programmable bias controlled by a bias control word $tw_{TDCS}[k]$ and the bias unit 314F has a programmable bias controlled by a bias control word $tw_{TDCF}[k]$. The least-significant bit (LSB) of the TDC 202 is defined by the difference between the delays provided by the bias units 314S, 314F, while the range is calculated by multiplying the LSB by the number of stages L1, L2, L3, . . . Ln, R1, R2, R3, . . . , Rn. For example if delay generated by the bias unit 314S delay is 30 ps and the delay generated by the bias unit 314F is 34 ps, the LSB is 4 ps. In some embodiments, the bias unit 314S has a static bias rather than a programmable bias.

The reference clock signal (CKR) and the feedback clock signal (CKF) propagate through the chains 300S, 300F with each stage L1, L2, L3, . . . Ln, R1, R2, R3, . . . , Rn having a cumulative delay that increases with the index of the stage.

In some embodiments, the TAs 310 have complementary outputs, and the appropriate output is selected based on whether the TA 310 is to trigger by outputting a logic one if CLR arrives first or if CKF arrives first. For this example assume, the TAs 310 in the left stages L1, L2, L3, . . . , Ln are configured to output a logic one if CKR arrives first and a logic zero if CKF arrives first, and the right stages R1, R2, R3, . . . , Rn are configured to output a logic one if CKF arrives first and a logic zero if CKR arrives first. The left stages L1, L2, L3, . . . , Ln will capture the phase error if CKR arrives first and the right stages, R1, R2, R3, . . . , Rn will capture the phase error if CKF arrives first. The quantized information on the time difference, can be obtained by multiplying the number of 1s by the LSB of the TDC 202, while the sign of the detection is defined by the relationship between the undelayed versions of CKR and CKF received by a time arbiter 316 and an associated flip flop 318. In an example, assume that CKR arrives 10 ps earlier than CKF and that the LSB is 4 ps (34 ps in slow chain 300S and 30 ps in fast chain 300F). Since CKR arrives earlier than CKF, the right side stages R1, R2, R3, . . . Rn in the fast chain 300F will not recover the delay and the associated TAs 310 output logic zeros. After the stage L1, the offset is 10 ps-4 ps=6 ps and the TA 310 will output a logic one. After the stage L2, the offset is 6 ps-4 ps=2 ps and the TA 310 will output a logic one. After the stage L2, the offset is 2 ps-4 ps=−2 ps and the TA 310 will output a logic zero since CKF arrives before CKR in the stage L3. All subsequent stages Ln will output a logic zero. The sign of the reading is defined by R0 and D0. For example, if CKR leads CKF, the sign is "+" and the measured delay is +8 ps (two logic ones multiplied by the LSB of 4 ps, and the quantization error is 2 ps. The clock of the FFs 312, 318 used to sample the TAs 310, 316 data (CKFF) can be derived from CKR or CKF, or some other clock.

The gain of the TDC 202 varies depending on the LSB. Without changing the gain $tw_{TDCS}[k]$, increasing the digital tuning code $tw_{TDCF}[k]$ increases the gain of the TDC 202 (1/LSB). Variation of the phase-detector gain can compromise the operation of the phase-locked loop by causing a variation of its bandwidth and potentially violating spot noise specifications or emission mask requirements. A nominal digital tuning code $tw_{TDCF}[k]$ sets a nominal gain $K^*_{TDC}$ defined for predefined optimal working conditions. Process spread causes the actual gain characteristic to shift up or down, for instance, in a fast-fast corner (FF), the delay of the buffers 302 decreases and the gain increases. The opposite happens in the slow-slow corner and the gain decreases. To compensate for process variation and ambient conditions, such as temperature, the TDC calibration unit 212 changes the digital tuning code $tw_{TDCF}[k]$ using a training sequence.

Figure 4:
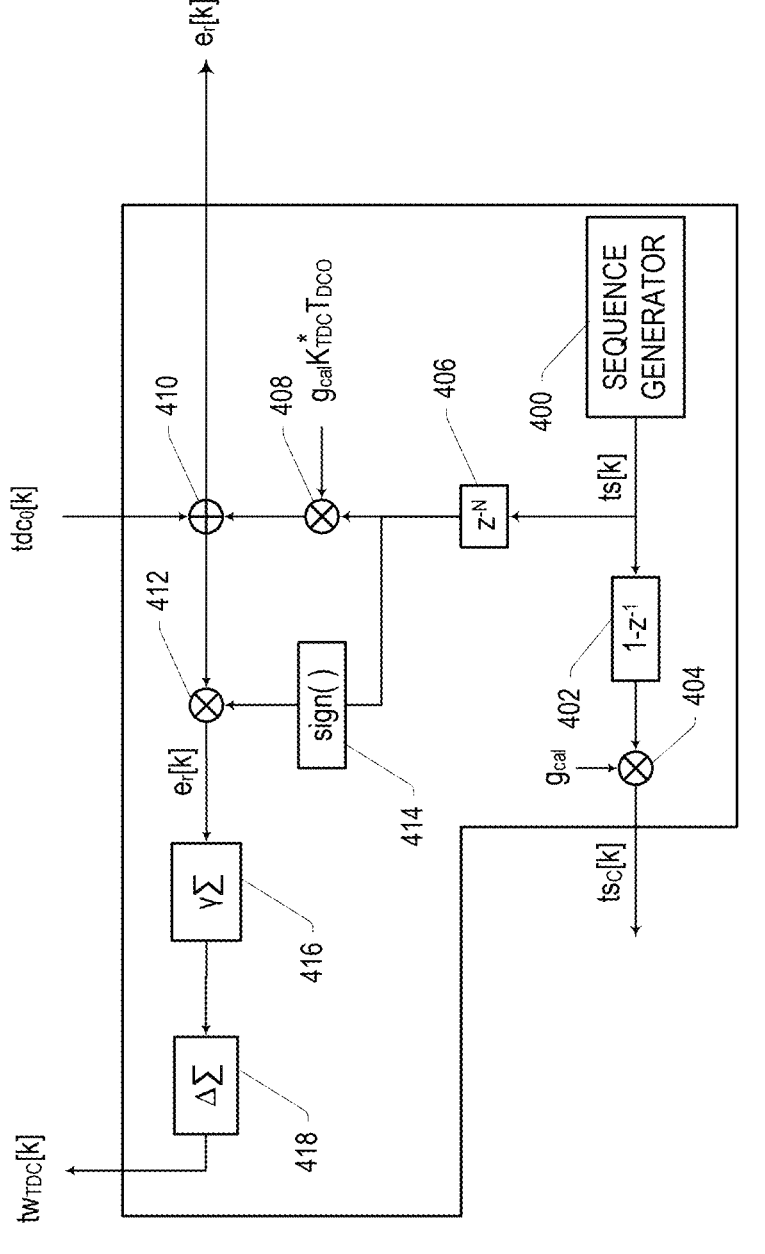
FIG. 4 is a diagram illustrating a TDC calibration unit, according to some embodiments.

FIG. 4 is a simplified block diagram of the TDC calibration unit 212, according to some embodiments. In some embodiments, the TDC calibration unit 212 comprises a sequence generator 400 that generates a training sequence (ts[k]). The training sequence (ts[k]) is differentiated in a derivative unit 402 and scaled by a calibration gain ($g_{cal}$) in a multiplier unit 404 to generate the scaled training sequence ($ts_C[k]$) that is summed with the FCW in FIG. 2. Referring to FIG. 2, the scaled training sequence ($ts_C[k]$) used to generate CKF is further scaled by the gain $K_{DTC}$ of the TDC 202 to generate $tdc_o[k]$. Hence, the gain of the calibration path is $g_{cal} \cdot T_V \cdot K_{TDC}$, where $T_V$ is the time period of the output clock (CKV).

In some embodiments, the training sequence ts[k] is also provided a delay unit 406 and a multiplier unit 408 that applies a scaling factor that incorporates the nominal gain for the TDC 202

$$(g_{cal} \cdot T_{dco} \cdot K^*_{TDC})$$

to generate a scaled nominal training sequence. An addition unit 410 compares the nominal scaled training sequence from the multiplier unit 408 to $tdc_o[k]$ to obtain a gain error signal which is multiplied in a multiplication unit 412 by the sign of the delayed training sequence that is determined by a sign unit 414 to generate an adjusted gain error signal ($e_r[k]$). In some embodiments, the sign unit 414 is omitted. An accumulator 416, such as a gamma sigma unit, scales the gain error signal ($e_r[k]$) by a factor $\gamma$ and accumulates the result. The TDC calibration unit 212 implements a least mean squared (LMS) loop to generate the gain error signal ($e_r[k]$). In some embodiments, an SDM 418 is provided after the accumulator 416 to quantize the tuning word, $tw_{TDC}[k]$. The SDM 418 can be also substituted by a floor function. In some embodiments, the tuning word $tw_{TDC}[k]$ corresponds to $tw_{TDCF}[k]$ in FIG. 3. In some embodiments, the TDC calibration unit 212 iterates the process by repeating the training sequence until convergence is reached. Dynamically detecting and calibrating the LSB of the TDC 202 by adjusting the tuning word $tw_{TDC}[k]$ for the TDC 202 accounts for process variations and possible environmental variation, for example, due to temperature variation.

Figure 5:
FIG. 5 is a diagram illustrating a frequency synthesizer, according to some embodiments.

FIG. 5 is a simplified block diagram of the frequency synthesizer 112, according to some embodiments. In the embodiment of FIG. 5, the gain error signal ($e_r[k]$) generated by the multiplier unit 408 in FIG. 4 (prior to sign correction) is provided by the TDC calibration unit 212 to the digital loop filter 204 for adjusting the DCO 206.

Figure 6:
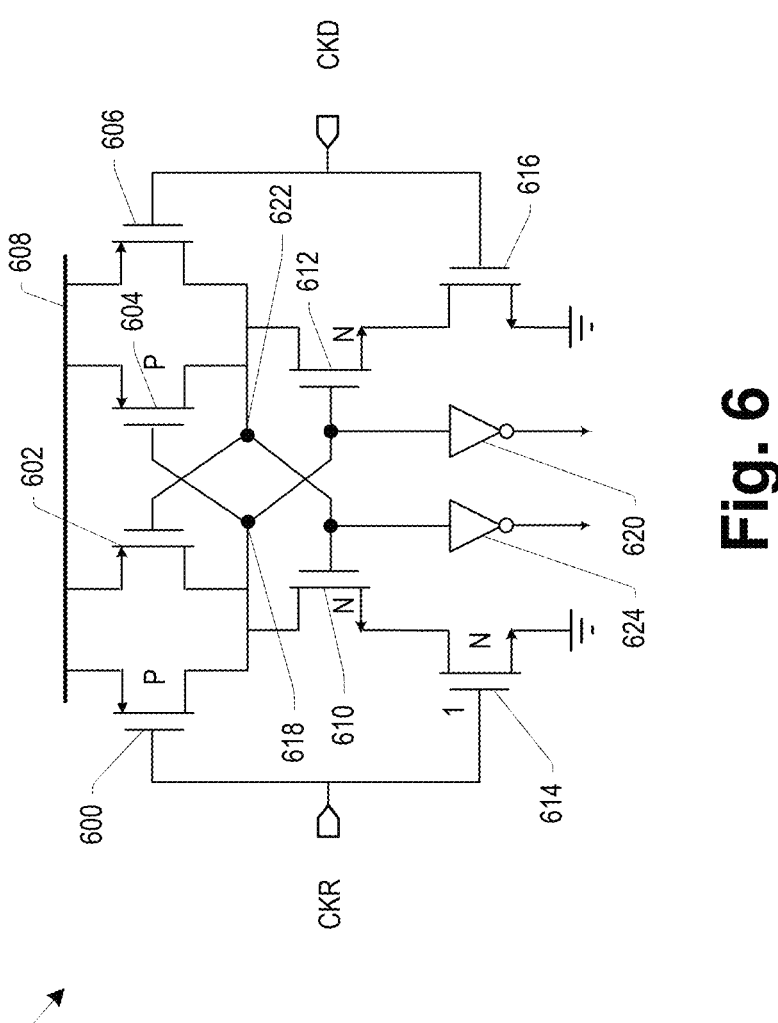
FIG. 6 is a diagram illustrating a time arbiter, according to some embodiments.

FIG. 6 is a simplified block diagram of the time arbiter 310, according to some embodiments. In some embodiments, the time arbiter 310 comprises pull-up transistors 600, 602, 604, 606 connected to a supply voltage terminal 608, an intermediate transistor 610 connected to the pull-up transistors 600, 602, an intermediate transistor 612 connected to the pull-up transistors 604, 606, and pull-down transistors 614, 616 connected to the intermediate transistors 610, 612, respectively. In some embodiments, the pull-up transistors 600, 602, 604, 606 are p-type transistors, and the intermediate transistors 610, 612 and pull-down transistors 614, 616 are n-type transistors. The CKR signal is provided to the gates of the pull-up transistor 600 and the pull-down transistor 614, and the CKF signal is provided to the gates of the pull-up transistor 606 and the pull-down transistor 616. The output of the pull-up transistor 600 at a node 618 controls the gates of the pull-up transistor 604 and the intermediate transistor 612 and provides an output signal to an inverter 620. The output of the pull-up transistor 606 at a node 622 controls the gates of the pull-up transistor 602 and the intermediate transistor 610 and provides an output signal to an inverter 624.

When both signals CKR and CKF are at a logic zero, the pull-up transistors 600, 606 are connected to the supply voltage terminal 608 which connects the nodes 618, 622 and the gates of the pull-up transistors 600, 606 and the intermediate transistors 610, 612 to the supply voltage terminal 608. The pull-down transistors 614, 616 are isolated from ground. The inverters 620, 624 both have logic ones at their inputs and output logic zeros.

Assuming the CKR signal transitions to a logic one before the CKF signal. The CKR logic one deactivates the pull-up transistor 600 and connects the pull-down transistor 614 to ground, thereby pulling the node 618 to ground and causing the inverter 620 to output a logic one and the inverter 624 to output a logic zero. Conversely, assuming the CKF signal transitions to a logic one before the CKR signal. The CKF logic one deactivates the pull-up transistor 606 and connects the pull-down transistor 616 to ground, thereby pulling the node 622 to ground and causing the inverter 620 to output a logic zero while the output of the inverter 624 outputs a logic one. In the example above the TAs 315 for the left stages L1, L2, L3, . . . , Ln employ the inverter 620 to generate the output and the TAs 315 for the right stages R1, R2, R3, . . . , Rn employ the inverter 620 to generate the output.

FIG. 7 is an illustration of an example method 700 for calibrating a digital phase locked loop, according to some embodiments. At 702, a digitally controlled oscillator 206 is controlled to generate an output clock signal. At 704, the output clock signal is divided to generate a first divided clock signal. At 706, a first feedback clock signal is generated in a digital-to-time converter 210 based on the divided clock signal. At 708, a first phase error signal is generated in a time-to-digital converter based on a first bias control word and a first phase difference between a reference clock signal and the first feedback clock signal. At 710, a calibration process is performed using a training sequence to generate a gain error signal. At 712, the first bias control word is modified based on the gain error signal to generate a modified first bias control word. At 714, a second phase error signal is generated in the time-to-digital converter for a second phase difference between the reference clock signal and a second feedback clock signal based on the modified first bias control word. The method 700 may be iterated until convergence is reached for the first modified bias control word.

Figure 8:
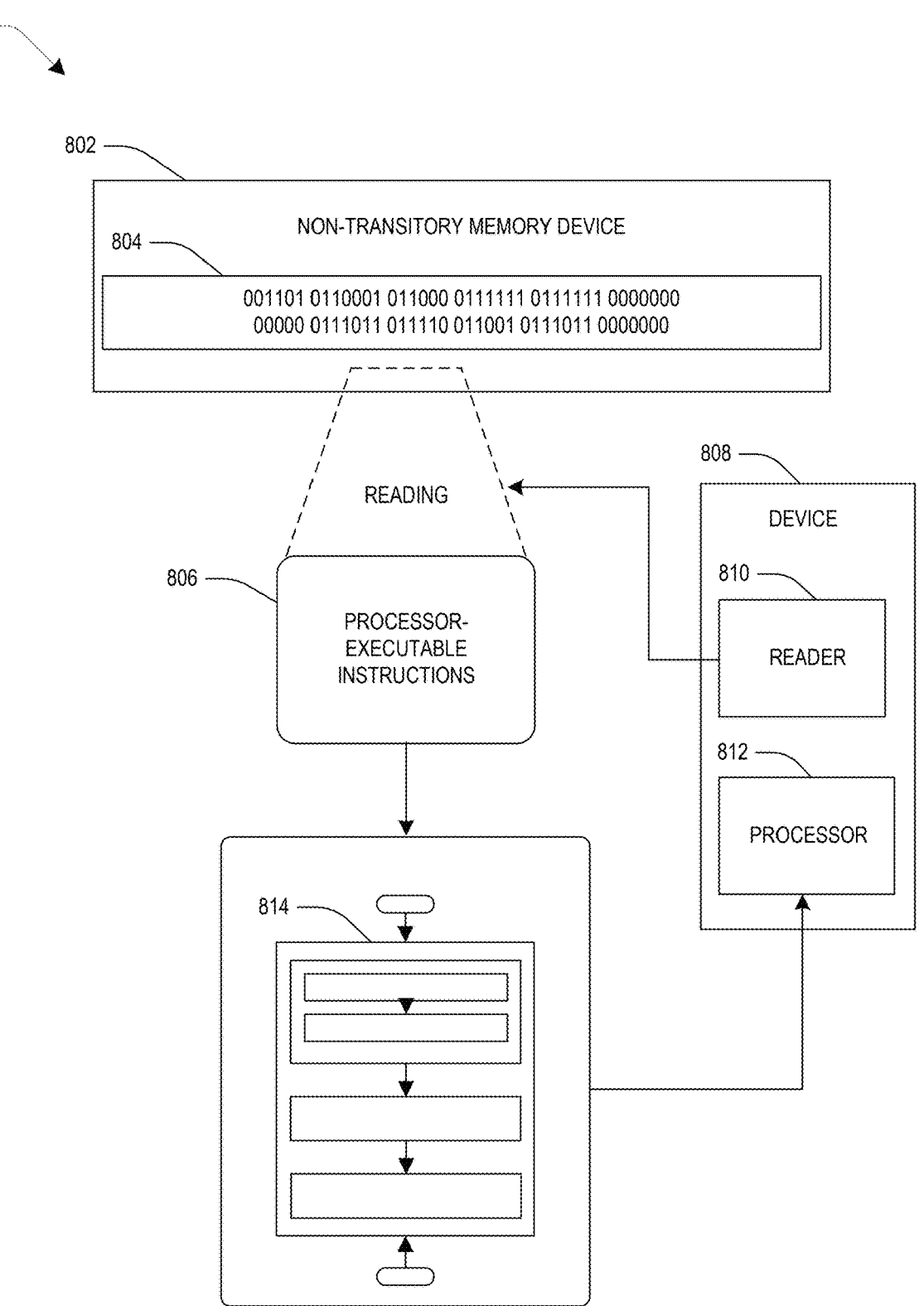
FIG. 8 is a diagram illustrating an example computer-readable medium, according to some embodiments.

FIG. 8 illustrates an exemplary embodiment 800 of a computer-readable medium 802, according to some embodiments. One or more embodiments involve a computer-readable medium comprising processor-executable instructions configured to implement one or more of the techniques presented herein. The embodiment 800 comprises a non-transitory computer-readable medium 802 (e.g., a CD-R, DVD-R, flash drive, a platter of a hard disk drive, etc.), on which is encoded computer-readable data 804. This computer-readable data 804 in turn comprises a set of processor-executable computer instructions 806 that, when executed by a computing device 808 including a reader 810 for reading the processor-executable computer instructions 806 and a processor 812 for executing the processor-executable computer instructions 806, are configured to facilitate operations according to one or more of the principles set forth herein. In some embodiments, the processor-executable computer instructions 806, when executed, are configured to facilitate performance of a method 814, such as at least some of the aforementioned method(s). In some embodiments, the processor-executable computer instructions 806, when executed, are configured to facilitate implementation of a system, such as at least some of the one or more aforementioned system(s). Many such computer-readable media may be devised by those of ordinary skill in the art that are configured to operate in accordance with the techniques presented herein.

The term "computer readable media" may include communication media. Communication media typically embodies computer readable instructions or other data in a "modulated data signal" such as a carrier wafer or other transport mechanism and includes any information delivery media. The term "modulated data signal" may include a signal that has one or more of its characteristics set or changed in such a manner as to encode information in the signal.

In an embodiment, a method comprises controlling a digitally controlled oscillator to generate an output clock signal, dividing the output clock signal to generate a first divided clock signal, generating, in a digital-to-time converter, a first feedback clock signal based on the divided clock signal, generating, in a time-to-digital converter, a first phase error signal based on a first bias control word and a first phase difference between a reference clock signal and the first feedback clock signal, performing a calibration process using a training sequence to generate a gain error signal, modifying the first bias control word based on the gain error signal to generate a modified first bias control word, and generating, in the time-to-digital converter, a second phase error signal for a second phase difference between the reference clock signal and a second feedback clock signal based on the modified first bias control word.

In an embodiment, the time-to-digital converter comprises a first chain of buffers comprising left side buffers and right side buffers having delays controlled by the first bias control word, and a second chain of buffers comprising left side buffers and right side buffers having delays controlled by a second bias control word, wherein generating the first phase error signal comprises providing the reference clock signal to the right side buffers of the first chain and the left side buffers of the second chain, and providing the feedback clock signal to the right side buffers of the second chain and the left side buffers of the first chain.

In an embodiment, the second bias control word comprises a fixed value.

In an embodiment, the first chain of buffers and the second chain of buffers are arranged in stages, each stage comprising a first buffer from one of the first chain or the first chain receiving the reference clock signal, a second buffer from the other of the first chain or the second chain receiving the feedback clock signal, and a latch element configured to determine which of the reference clock signal or the feedback clock signal is detected first in the stage, and generating the first phase error signal comprises generating the first phase error signal based on values of the latch elements for the stages.

In an embodiment, the latch element comprises a time arbiter.

In an embodiment, performing the calibration process comprises differentiating and scaling the training sequence by a calibration gain to generate a scaled training sequence, generating a second divided clock signal based on the scaled training sequence, delaying and scaling the training sequence by the calibration gain and a nominal time-to-digital converter gain to generate a nominal scaled training sequence, generating, in the digital-to-time converter, a second feedback clock signal based on the second divided clock signal, generating, in the time-to-digital converter, a third phase error signal based on a third phase difference between the reference clock signal and the second feedback clock signal and the first bias control word, and comparing the nominal scaled training sequence to the third phase error signal to generate the gain error signal.

In an embodiment, a frequency synthesizer comprises a digitally controlled oscillator configured to generate an output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, a loop filter connected to the time-to-digital converter and configured to generate the digital control word based on the phase error signal, and a calibration unit configured to generate a training sequence to generate a gain error signal, and modify the bias control word based on the gain error signal to generate a modified bias control word.

In an embodiment, the time-to-digital converter comprises a first chain of buffers comprising left side buffers and right side buffers having delays controlled by the bias control word, and a second chain of buffers comprising left side buffers and right side buffers having delays controlled by a second bias control word, wherein the reference clock signal is connected to the right side buffers of the first chain and the left side buffers of the second chain, and the feedback clock signal is connected to the right side buffers of the second chain and the left side buffers of the first chain.

In an embodiment, the second bias control word comprises a fixed value.

In an embodiment, the first chain of buffers and the second chain of buffers are arranged in stages, each stage comprising a first buffer from one of the first chain or the first chain receiving the reference clock signal, a second buffer from the other of the first chain or the second chain receiving the feedback clock signal, and a latch element configured to determine which of the reference clock signal or the feedback clock signal is detected first in the stage, and the phase error signal is generated based on values of the latch elements for the stages.

In an embodiment, the latch element comprises a time arbiter.

In an embodiment, the latch element comprises a flip flop connected to the time arbiter.

In an embodiment, the calibration unit is configured to differentiate and scale the training sequence by a calibration gain to generate a scaled training sequence and delay and scale the training sequence by the calibration gain and a nominal time-to-digital converter gain to generate a nominal scaled training sequence, the clock divider is configured to generate the divided clock signal based on the scaled training sequence, and the calibration unit is configured to compare the nominal scaled training sequence to the phase error signal to generate the gain error signal.

In an embodiment, a radio comprises an antenna port, a transmit-receive switch connected to the antenna port, a receive path connected to the transmit-receive switch, and a transmit path connected to the transmit-receive switch, and a processor configured to connect the receive path to the transmit-receive switch in a receive mode of the radio and connect the transmit path to the transmit-receive switch in a transmit mode of the radio, wherein the transmit path comprises a frequency synthesizer configured to generate an output clock signal, a local oscillator generator configured to generate a local oscillator signal based on the output clock signal, and a power amplifier connected to the transmit-receive switch and configured to amplify the local oscillator signal to generate a transmit signal, and the frequency synthesizer comprises a digitally controlled oscillator configured to generate an output clock signal based on a digital control word, a clock divider configured to divide the output clock signal to generate a divided clock signal, a digital-to-time converter configured to generate a feedback clock signal based on the divided clock signal, a time-to-digital converter configured to generate a phase error signal based on a bias control word and a phase difference between a reference clock signal and the feedback clock signal, a loop filter connected to the time-to-digital converter and configured to generate the digital control word based on the phase error signal, and a calibration unit configured to generate a training sequence to generate a gain error signal, and modify the bias control word based on the gain error signal to generate a modified bias control word.

In an embodiment, the time-to-digital converter comprises a first chain of buffers comprising left side buffers and right side buffers having delays controlled by the bias control word, and a second chain of buffers comprising left side buffers and right side buffers having delays controlled by a second bias control word, wherein the reference clock signal is connected to the right side buffers of the first chain and the left side buffers of the second chain, and the feedback clock signal is connected to the right side buffers of the second chain and the left side buffers of the first chain.

In an embodiment, the second bias control word comprises a fixed value.

In an embodiment, the first chain of buffers and the second chain of buffers are arranged in stages, each stage comprising a first buffer from one of the first chain or the first chain receiving the reference clock signal, a second buffer from the other of the first chain or the second chain receiving the feedback clock signal, and a latch element configured to determine which of the reference clock signal or the feedback clock signal is detected first in the stage, and the phase error signal is generated based on values of the latch elements for the stages.

In an embodiment, the latch element comprises a timer arbiter.

In an embodiment, the latch element comprises a flip flop connected to the time arbiter.

In an embodiment, the calibration unit is configured to differentiate and scale the training sequence by a calibration gain to generate a scaled training sequence, and delay and scale the training sequence by the calibration gain and a nominal time-to-digital converter gain to generate a nominal scaled training sequence, the clock divider is configured to generate the divided clock signal based on the scaled training sequence, and the calibration unit is configured to compare the nominal scaled training sequence to the phase error signal to generate the gain error signal.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In an embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" and/or the like is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A method, comprising:

controlling a digitally controlled oscillator to generate an output clock signal;

dividing the output clock signal to generate a first divided clock signal;

generating, in a digital-to-time converter, a first feedback clock signal based on the divided clock signal;

generating, in a time-to-digital converter, a first phase error signal based on a first bias control word and a first phase difference between a reference clock signal and the first feedback clock signal;

performing a calibration process utilizing a training sequence to generate a gain error signal;

modifying the first bias control word based on the gain error signal to generate a modified first bias control word; and generating, in the time-to-digital converter, a second phase error signal for a second phase difference between the reference clock signal and a second feedback clock signal based on the modified first bias control word.

2. The method of claim 1, wherein:

the time-to-digital converter comprises:

a first chain of buffers comprising left side buffers having delays controlled by the first bias control word and right side buffers having delays controlled by the first bias control word; and a second chain of buffers comprising left side buffers having delays controlled by a second bias control word and right side buffers having delays controlled by the second bias control word, wherein:

generating the first phase error signal comprises:

providing the reference clock signal to the right side buffers of the first chain and the left side buffers of the second chain; and providing the first feedback clock signal to the right side buffers of the second chain and the left side buffers of the first chain.

3. The method of claim 2, wherein:

the second bias control word comprises a fixed value.

4. The method of claim 2, wherein:

the first chain of buffers and the second chain of buffers are arranged in stages;

each stage comprises:

a first buffer from one of the first chain or the first chain receiving the reference clock signal;

a second buffer from the other of the first chain or the second chain receiving the feedback clock signal; and a latch element configured to determine which of the reference clock signal or the feedback clock signal is detected first in the stage; and generating the first phase error signal comprises:

generating the first phase error signal based on values of the latch elements for the stages.

5. The method of claim 4, wherein:

the latch element comprises a time arbiter.

6. The method of claim 1, wherein:

performing the calibration process comprises:

differentiating and scaling the training sequence by a calibration gain to generate a scaled training sequence;

generating a second divided clock signal based on the scaled training sequence;

delaying and scaling the training sequence by the calibration gain and a nominal time-to-digital converter gain to generate a nominal scaled training sequence;

generating, in the digital-to-time converter, a third feedback clock signal based on the second divided clock signal;

generating, in the time-to-digital converter, a third phase error signal based on a third phase difference between the reference clock signal and the third feedback clock signal and the first bias control word; and comparing the nominal scaled training sequence to the third phase error signal to generate the gain error signal.

7. A frequency synthesizer, comprising:

a digitally controlled oscillator configured to generate an output clock signal based on a digital control word;

a clock divider configured to divide the output clock signal to generate a divided clock signal;

a digital-to-time converter configured to generate a feedback clock signal based on the divided clock signal;

a time-to-digital converter configured to generate a phase error signal based on a bias control word and a phase difference between a reference clock signal and the feedback clock signal;

a loop filter connected to the time-to-digital converter and configured to generate the digital control word based on the phase error signal; and a calibration unit configured to:

generate a training sequence;

generate a gain error signal by utilizing the training sequence; and modify the bias control word based on the gain error signal to generate a modified bias control word.

8. The frequency synthesizer of claim 7, wherein the time-to-digital converter comprises:

a first chain of buffers comprising left side buffers having delays controlled by the bias control word and right side buffers having delays controlled by the bias control word; and a second chain of buffers comprising left side buffers having delays controlled by a second bias control word and right side buffers having delays controlled by the second bias control word, wherein:

the reference clock signal is connected to the right side buffers of the first chain and the left side buffers of the second chain; and the feedback clock signal is connected to the right side buffers of the second chain and the left side buffers of the first chain.

9. The frequency synthesizer of claim 8, wherein:

the second bias control word comprises a fixed value.

10. The frequency synthesizer of claim 8, wherein:

the first chain of buffers and the second chain of buffers are arranged in stages;

each stage comprises:

a first buffer from one of the first chain or the first chain receiving the reference clock signal;

a second buffer from the other of the first chain or the second chain receiving the feedback clock signal; and a latch element configured to determine which of the reference clock signal or the feedback clock signal is detected first in the stage; and the phase error signal is generated based on values of the latch elements for the stages.

11. The frequency synthesizer of claim 10, wherein:

the latch element comprises a time arbiter.

12. The frequency synthesizer of claim 11, wherein:

the latch element comprises a flip flop connected to the time arbiter.

13. The frequency synthesizer of claim 7, wherein:

the calibration unit is configured to:

differentiate and scale the training sequence by a calibration gain to generate a scaled training sequence; and delay and scale the training sequence by the calibration gain and a nominal time-to-digital converter gain to generate a nominal scaled training sequence;

the clock divider is configured to:

generate the divided clock signal based on the scaled training sequence; and the calibration unit is configured to:

compare the nominal scaled training sequence to the phase error signal to generate the gain error signal.

14. A radio, comprising:

an antenna port;

a transmit-receive switch connected to the antenna port;

a receive path connected to the transmit-receive switch;

a transmit path connected to the transmit-receive switch; and a processor configured to connect the receive path to the transmit-receive switch in a receive mode of the radio and connect the transmit path to the transmit-receive switch in a transmit mode of the radio, wherein:

the transmit path comprises:

a frequency synthesizer configured to generate an output clock signal;

a local oscillator generator configured to generate a local oscillator signal based on the output clock signal; and a power amplifier connected to the transmit-receive switch and configured to amplify the local oscillator signal to generate a transmit signal; and the frequency synthesizer comprises:

a digitally controlled oscillator configured to generate the output clock signal based on a digital control word;

a clock divider configured to divide the output clock signal to generate a divided clock signal;

a digital-to-time converter configured to generate a feedback clock signal based on the divided clock signal;

a time-to-digital converter configured to generate a phase error signal based on a bias control word and a phase difference between a reference clock signal and the feedback clock signal;

a loop filter connected to the time-to-digital converter and configured to generate the digital control word based on the phase error signal; and a calibration unit configured to:

generate a training sequence;

generate a gain error signal by utilizing the training sequence; and modify the bias control word based on the gain error signal to generate a modified bias control word.

15. The radio of claim 14, wherein the time-to-digital converter comprises:

a first chain of buffers comprising left side buffers having delays controlled by the bias control word and right side buffers having delays controlled by the bias control word; and a second chain of buffers comprising left side buffers having delays controlled by a second bias control word and right side buffers having delays controlled by the second bias control word, wherein:

the reference clock signal is connected to the right side buffers of the first chain and the left side buffers of the second chain; and the feedback clock signal is connected to the right side buffers of the second chain and the left side buffers of the first chain.

16. The radio of claim 15, wherein:

the second bias control word comprises a fixed value.

17. The radio of claim 15, wherein:

the first chain of buffers and the second chain of buffers are arranged in stages;

each stage comprises:

a first buffer from one of the first chain or the first chain receiving the reference clock signal;

a second buffer from the other of the first chain or the second chain receiving the feedback clock signal; and a latch element configured to determine which of the reference clock signal or the feedback clock signal is detected first in the stage; and the phase error signal is generated based on values of the latch elements for the stages.

18. The radio of claim 17, wherein:

the latch element comprises a timer arbiter.

19. The radio of claim 18, wherein:

the latch element comprises a flip flop connected to the time arbiter.

20. The radio of claim 15, wherein:

the calibration unit is configured to:

differentiate and scale the training sequence by a calibration gain to generate a scaled training sequence; and delay and scale the training sequence by the calibration gain and a nominal time-to-digital converter gain to generate a nominal scaled training sequence;

the clock divider is configured to:

generate the divided clock signal based on the scaled training sequence; and the calibration unit is configured to:

compare the nominal scaled training sequence to the phase error signal to generate the gain error signal.

* * * * *